(12) United States Patent
Lee

(10) Patent No.: US 9,831,849 B2
(45) Date of Patent: Nov. 28, 2017

(54) SURFACE ACOUSTIC WAVE ELEMENT AND METHOD OF MANUFACTURING THE SAME

(71) Applicant: WISOL CO., LTD., Osan-si, Gyeonggi-do (KR)

(72) Inventor: Hunyong Lee, Hwaseong-si (KR)

(73) Assignee: WISOL CO., LTD., Osan-si, Gyeonggi-do (KR)

( * ) Notice: Subject to any disclaimer, the term of this patent is extended or adjusted under 35 U.S.C. 154(b) by 114 days.

(21) Appl. No.: 14/933,053

(22) Filed: Nov. 5, 2015

(65) Prior Publication Data

US 2016/0126927 A1    May 5, 2016

(30) Foreign Application Priority Data

Nov. 5, 2014    (KR) .................. 10-2014-0152721

(51) Int. Cl.
    H03H 9/02    (2006.01)
    H03H 9/10    (2006.01)

(52) U.S. Cl.
    CPC ...... *H03H 9/02992* (2013.01); *H03H 9/1071* (2013.01)

(58) Field of Classification Search
    CPC .................. H03H 9/02992; H03H 9/1071
    USPC ................... 333/133, 193–196; 310/364
    See application file for complete search history.

(56) References Cited

U.S. PATENT DOCUMENTS

| 8,008,837 B2 * | 8/2011 | Fukano ............... H03H 9/059 29/25.35 |
| 2004/0207485 A1 * | 10/2004 | Kawachi ............ H03H 9/0547 333/133 |
| 2005/0264375 A1 * | 12/2005 | Ikuta .................... H03H 9/725 333/133 |

FOREIGN PATENT DOCUMENTS

| CN | 101192817 A | 6/2008 |
| JP | 2002-261560 A | 9/2002 |
| JP | 2011-182153 A | 9/2011 |
| JP | 2012-005033 A | 1/2012 |
| WO | 2008/081935 A1 | 7/2008 |

OTHER PUBLICATIONS

SIPO Office Action dated Sep. 12, 2017 for Chinese Application No. 201510746144.6 which corresponds to the above-referenced U.S. application.

* cited by examiner

*Primary Examiner* — Robert Pascal
*Assistant Examiner* — Jorge Salazar, Jr.
(74) *Attorney, Agent, or Firm* — LRK Patent Law Firm

(57) ABSTRACT

The present invention relates to a surface acoustic wave element and a method of manufacturing the same, and more specifically, to a surface acoustic wave element and a method of manufacturing the same, the element including a piezoelectric substrate; a plurality of IDT electrodes formed on the piezoelectric substrate; a plurality of resonator electrodes formed on the piezoelectric substrate; a wiring metal layer formed as a wiring area to electrically connect the plurality of IDT electrodes and the plurality of resonator electrodes; and an insulation layer formed on the piezoelectric substrate, the plurality of IDT electrodes, the plurality of resonator electrodes and the wiring metal layer.

15 Claims, 4 Drawing Sheets

SURFACE ACOUSTIC WAVE ELEMENT AND METHOD OF MANUFACTURING THE SAME

BACKGROUND OF THE INVENTION

1. Field of the Invention

The present invention relates to a surface acoustic wave element and a method of manufacturing the same, and more specifically, to a surface acoustic wave element and a method of manufacturing the same, the element including a piezoelectric substrate, a plurality of IDT electrodes formed on the piezoelectric substrate; a plurality of resonator electrodes formed on the piezoelectric substrate; a wiring metal layer formed as a wiring area to electrically connect the plurality of IDT electrodes and the plurality of resonator electrodes; and an insulation layer formed on the piezoelectric substrate, the plurality of IDT electrodes, the plurality of resonator electrodes and the wiring metal layer.

2. Background of the Related Art

A surface acoustic wave (SAW) filter generates a surface acoustic wave on the surface of a substrate when an electrical signal is input from any one direction, and such a mechanical wavelength is converted into an electrical signal again, and only signals of the same frequency remain in this process. Accordingly, the surface acoustic wave filter functions as a filter passing only the frequencies of the same mechanical frequency that the filter has.

Recently, in response to a request for manufacturing a small and thin surface acoustic wave filter, a technique of manufacturing a surface acoustic wave filter using a wafer level package (WLP) method, which is a method of drilling a hole in a silicon wafer, inserting a light emitting diode chip therein and packaging the filter, is developed as a packaging technique combining a silicon semiconductor processing technique and a light emitting diode technique. Compared with an existing chip scale package (CSP) method of bonding a piezoelectric element and a separate substrate, the WLP method has an advantage of completing a product using only the piezoelectric element.

At this point, the surface acoustic wave filter is manufactured by forming a cavity on the piezoelectric element, and there is a problem in that if the adhesive force between the piezoelectric element, electrodes and a wiring metal layer is lowered in forming the cavity, the probability of generating a fault in a part is very high in an environment in which high humidity is maintained.

SUMMARY OF THE INVENTION

Therefore, the present invention has been made in view of the above problems, and it is an object of the present invention to improve characteristics and reliability of a surface acoustic wave filter by effectively designing electrodes and a wiring metal layer formed on a piezoelectric substrate to improve adhesive force in a process of manufacturing the filter using a wafer level package method in response to a request for manufacturing a small and thin surface acoustic wave filter.

In addition, another object of the present invention to provide a surface acoustic wave element and a method of manufacturing the same, the element including a piezoelectric substrate; a plurality of IDT electrodes formed on the piezoelectric substrate; a plurality of resonator electrodes formed on the piezoelectric substrate; a wiring metal layer formed as a wiring area to electrically connect the plurality of IDT electrodes and the plurality of resonator electrodes; and an insulation layer formed on the piezoelectric substrate, the plurality of IDT electrodes, the plurality of resonator electrodes and the wiring metal layer.

To accomplish the above objects, according to one aspect of the present invention, there is provided a surface acoustic wave element including: a piezoelectric substrate; a plurality of IDT electrodes formed on the piezoelectric substrate; a plurality of resonator electrodes formed on the piezoelectric substrate; a wiring metal layer formed as a wiring area to electrically connect the plurality of IDT electrodes and the plurality of resonator electrodes; and an insulation layer formed on the piezoelectric substrate, the plurality of IDT electrodes, the plurality of resonator electrodes and the wiring metal layer.

In addition, when the wiring area is formed, the wiring metal layer may be formed to surround the plurality of resonator electrodes and directly contact with the piezoelectric substrate.

In addition, the width of the wiring metal layer directly contacting with the piezoelectric substrate may be 5 µm or more.

In addition, the wiring metal layer and the resonator electrode may include one or more of aluminum (Al), titanium (Ti) and gold (Au), and the wiring metal layer may be formed of titanium (Ti), and the resonator electrode may be formed of aluminum (Al).

In addition, the insulation layer may include one or more of silicon nitride (SiNx) and silicon dioxide (SiO2).

In addition, when the plurality of IDT electrodes and the plurality of resonator electrodes are formed, the electrodes may be formed by etching after vacuum deposition of a sputtering method is performed.

Meanwhile, the surface acoustic wave element may further include a wall formed on the insulation layer; and a roof formed on the wall to create a cavity.

In addition, the wall and the roof may be formed of photosensitive resin.

Meanwhile, to accomplish the above objects, according to another aspect of the present invention, there is provided a method of manufacturing a surface acoustic wave element, the method including the steps of: (a) forming a plurality of IDT electrodes and a plurality of resonator electrodes on a piezoelectric substrate; (b) forming a wiring metal layer as a wiring area to connect the plurality of IDT electrodes and the plurality of resonator electrodes; and (c) forming an insulation layer on the piezoelectric substrate, the plurality of IDT electrodes, the plurality of resonator electrodes and the wiring metal layer.

In addition, when the wiring area is formed at step (b), the wiring metal layer may be formed to surround the plurality of resonator electrodes and directly contact with the piezoelectric substrate.

In addition, the width of the wiring metal layer directly contacting with the piezoelectric substrate may be 5 µm or more.

In addition, the wiring metal layer and the resonator electrode may include one or more of aluminum (Al), titanium (Ti) and gold (Au), and the wiring metal layer may be formed of titanium (Ti), and the resonator electrode may be formed of aluminum (Al).

In addition, the insulation layer may include one or more of silicon nitride (SiNx) and silicon dioxide (SiO2).

In addition, when the plurality of IDT electrodes and the plurality of resonator electrodes are formed at step (a), the electrodes may be formed by etching after vacuum deposition of a sputtering method is performed.

In addition, the method of manufacturing a surface acoustic wave element may further include the steps of: (d)

forming a wall on the insulation layer; and (e) forming a roof on the wall to cover the wall and create a cavity.

In addition, the wall and the roof may be formed of photosensitive resin.

DETAILED DESCRIPTION OF THE PREFERRED EMBODIMENT

Details of the objects and technical configuration of the present invention and operational effects according thereto will be more clearly understood by the detailed description described below based on the accompanying drawings attached in the specification of the present invention. The embodiments according to the present invention will be hereafter described in detail, with reference to the accompanying drawings.

Figure 1:
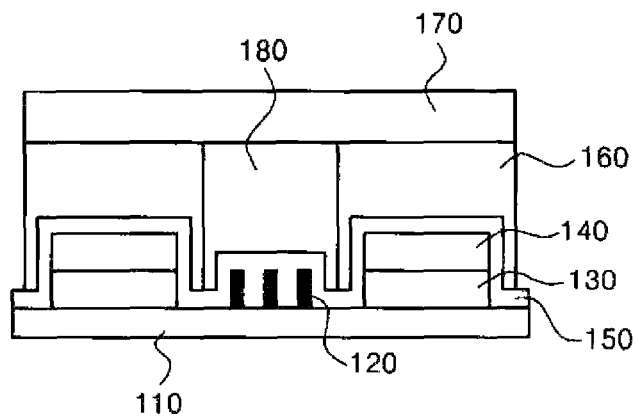
FIG. 1 is a cross-sectional view schematically showing the configuration of a surface acoustic wave element according to an embodiment of the prior art.
Figure 2:
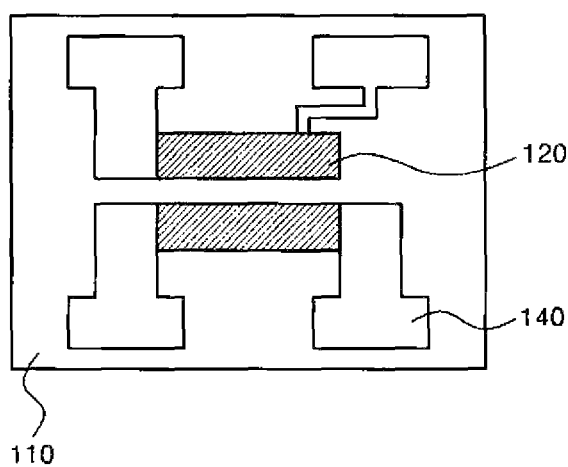
FIG. 2 is a top view showing the configuration of a surface acoustic wave element according to an embodiment of the prior art.

FIGS. 1 and 2 are cross-sectional and perspective views schematically showing the configuration of a surface acoustic wave element according to an embodiment of the prior art.

Referring to FIG. 1, when a surface acoustic wave element is manufactured, there is a method of sealing a cavity on a piezoelectric element with a photosensitive resin such as a photoresist or the like using a wafer level package method.

At this point, the surface acoustic wave element may include all of various devices which use a surface acoustic wave (SAW), such as a surface acoustic wave filter, a surface acoustic wave sensor, a surface acoustic wave pressure sensor, a surface acoustic wave temperature sensor, a surface acoustic wave resonator filter, a surface acoustic wave device, a surface acoustic wave converter and the like.

In addition, the wafer level package may reduce thickness of the surface acoustic wave element greatly since a lead frame is inserted into a PCB type package frame without the need of packaging, improve productivity and throughput greatly since thousands of elements can be packaged at the same time, and minimize generation of heat, which is a problem of a light emitting diode, owing to high thermal conductivity.

However, when a resonator electrode 130 and a wiring metal layer 140 are formed on a piezoelectric substrate 110, adhesive force of the boundary surface between the aluminum mainly used as the resonator electrode and the titanium mainly used as the wiring metal layer is weak, and thus there is a problem in that a delamination phenomenon occurs due to the stress generated by a wall having a high thermal expansion coefficient.

FIG. 2 is a top view showing the configuration of a surface acoustic wave element according to an embodiment of the prior art, which shows the piezoelectric substrate of FIG. 1 from the top.

Referring to FIG. 2, in the prior art, a plurality of IDT electrodes 120 and a plurality of resonator electrodes 130 are formed on the piezoelectric substrate 110, and a wiring metal layer 140 is covered right upon the top of the resonator electrodes 130 to form an electrical connection passage.

Figure 3:
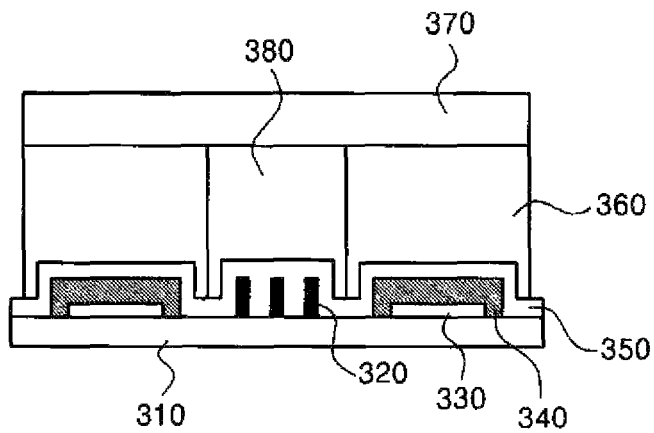
FIG. 3 is a cross-sectional view schematically showing the configuration of a surface acoustic wave element according to an embodiment of the present invention.
Figure 4:
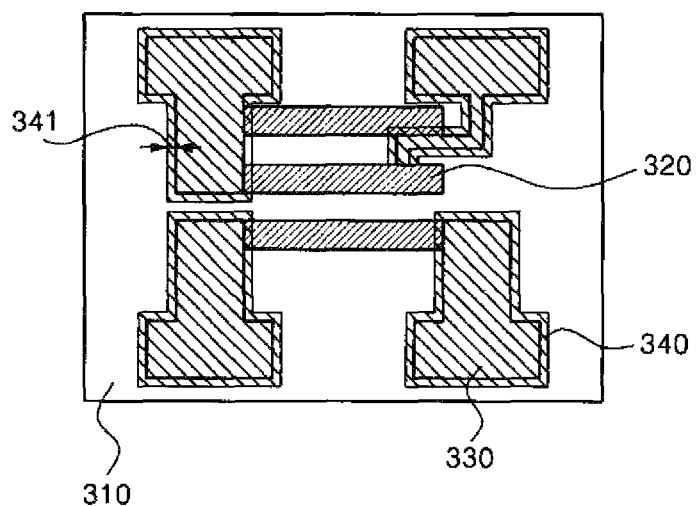
FIG. 4 is a top view showing the configuration of a surface acoustic wave element according to an embodiment of the present invention.

FIGS. 3 and 4 are cross-sectional and perspective views schematically showing the configuration of a surface acoustic wave element according to an embodiment of the present invention.

FIG. 3 is a cross-sectional view schematically showing the configuration of a surface acoustic wave element according to an embodiment of the present invention.

Referring to FIG. 4, a surface acoustic wave element may include a piezoelectric substrate 310, a plurality of IDT electrodes 320, a plurality of resonator electrodes 330, a wiring metal layer 340, an insulation layer 350, a wall 360 and a roof 370.

At this point, the surface acoustic wave element may include all of various devices using a surface acoustic wave (SAW), such as a surface acoustic wave filter, surface acoustic wave sensor, a surface acoustic wave pressure sensor, a surface acoustic wave temperature sensor, a surface acoustic wave resonator filter, a surface acoustic wave device, a surface acoustic wave converter and the like.

A circuit pattern including a pad and several electrodes is formed on the piezoelectric substrate using wafer level package method. A surface acoustic wave (SAW) can be transferred using a piezoelectric material of the piezoelectric substrate, and, at this point, it is preferable that a cavity is formed on the piezoelectric substrate to efficiently transfer the surface acoustic wave.

At this point, lead zirconate titanate (PZT), crystal, lithium niobate (LiNbO3), tantalate (LiTaO3) or the like can be used as a piezoelectric material used for manufacturing the piezoelectric substrate.

The IDT electrode 320 is formed on the piezoelectric substrate and may be configured in plurality. The Interdigital transducer (IDT) electrodes are formed on the piezoelectric substrate, the surface acoustic wave (SAW) can be efficiently generated, detected and controlled.

The resonator electrode 330 is formed on the piezoelectric substrate and may be configured in plurality.

In addition, it is preferable that the plurality of IDT electrodes and the plurality of resonator electrodes are formed in a method of etching after vacuum deposition of a sputtering method is performed when the electrodes are formed on the piezoelectric substrate.

The wiring metal layer 340 is formed as a wiring area to electrically connect the plurality of IDT electrodes and the plurality of resonator electrodes.

In addition, the wiring metal layer and the resonator electrode may include one or more of aluminum (Al), titanium (Ti) and gold (Au), and, particularly, it is preferable that the wiring metal layer is formed of titanium (Ti) and the resonator electrode is formed of aluminum (Al).

At this point, when the wiring area is formed, it is preferable that the wiring metal layer is formed to surround the plurality of resonator electrodes and directly contact with the piezoelectric substrate. Although the prior art has a problem of delamination occurring in the substrate since the wiring metal layer is positioned on the resonator electrodes and thus adhesive force between the wiring metal layer and the resonator electrodes is lowered, the adhesive force can be increased greatly since the wiring metal layer directly contacts with the piezoelectric substrate in the form of surrounding the resonator electrodes.

Since the bonding force of the bonding interface between the titanium and the piezoelectric substrate is excellent although the bonding force of the bonding interface between the aluminum of the resonator electrodes and the titanium of the wiring metal layer is poor, it is advantageous in that reliability and characteristics of parts are improved simultaneously by designing the surface acoustic wave element to minimize the bonding area between the resonator electrodes and the wiring metal layer and maximize the bonding area between the wiring metal layer and the piezoelectric substrate.

In addition, when the wiring metal layer surrounds the resonator electrodes, the width 341 of the wiring metal layer directly contacting with the piezoelectric substrate is preferably at least 5 μm or more.

Figure 5:
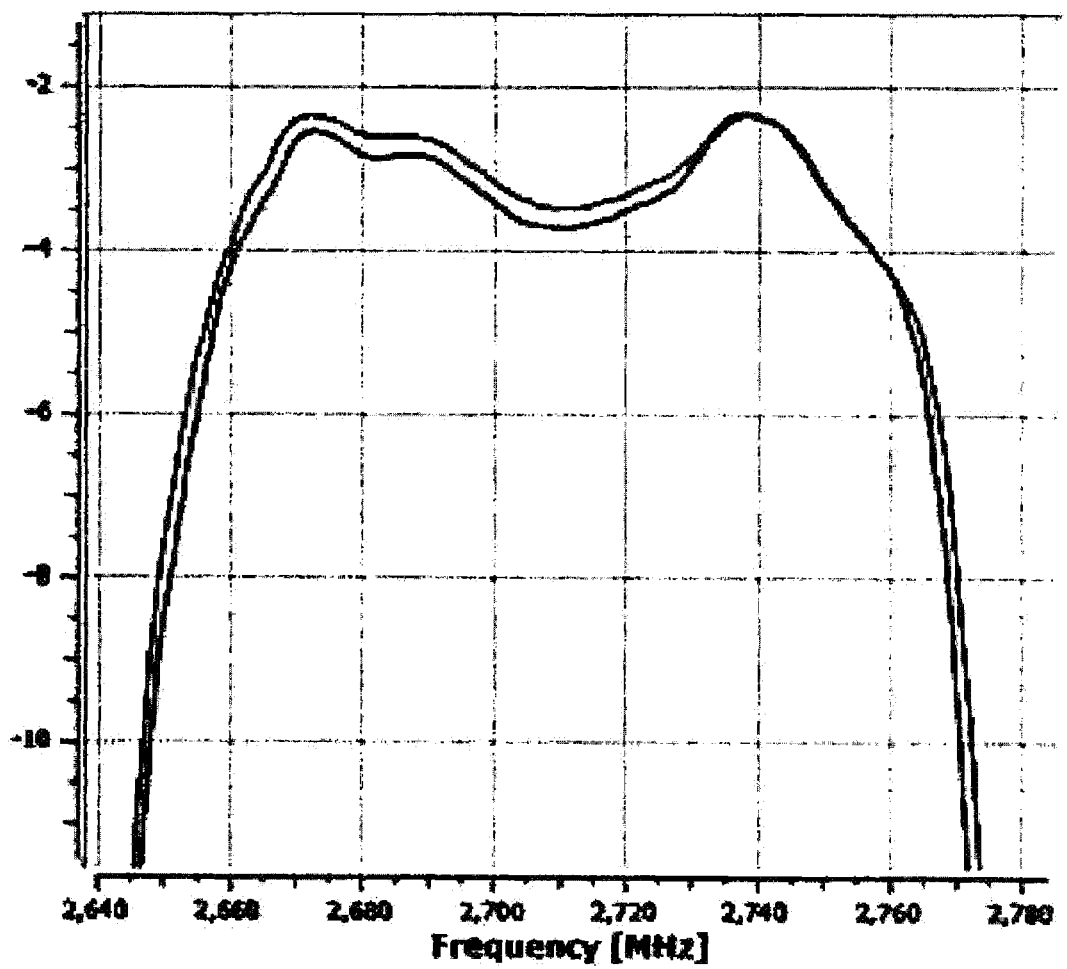
FIG. 5 is a view showing the frequency characteristic comparing a surface acoustic wave element according to an embodiment of the present invention with a surface acoustic wave element according to an embodiment of the prior art.

As shown in the frequency of FIG. 5 comparing the surface acoustic wave element of the present invention with that of the embodiment of the prior art, compared with a case of simply forming the wiring metal layer on a resonator electrode film as shown in the prior art (the red line), if the wiring metal layer surrounds the resonator electrodes and directly contacts with the piezoelectric substrate while maintaining a predetermined width (the green line) as shown in the present invention, a result of further improving a gain width can be obtained while constantly maintaining the frequency characteristic.

The insulation layer 350 is formed on the piezoelectric substrate, the plurality of IDT electrodes, the plurality of resonator electrodes and the wiring metal layer to protect the substrate itself and the electrodes. At this point, the insulation layer is preferably formed of silicon nitride (SiNx) or silicon dioxide (SiO2).

Meanwhile, the surface acoustic wave element may further include a wall 360 formed on the insulation layer and a roof 370 formed on the wall to create a cavity 380.

The wall 360 is formed on the insulation layer which protects the piezoelectric substrate and the electrodes and forms the cavity 380, which is an empty space of the element, together with the roof 370. At this point, the wall and the roof are preferably formed of photosensitive resin (photoresist; PR).

FIG. 4 is a top view showing the configuration of a surface acoustic wave element according to an embodiment of the present invention, which shows the piezoelectric substrate of FIG. 3 from the top.

Figure 6:
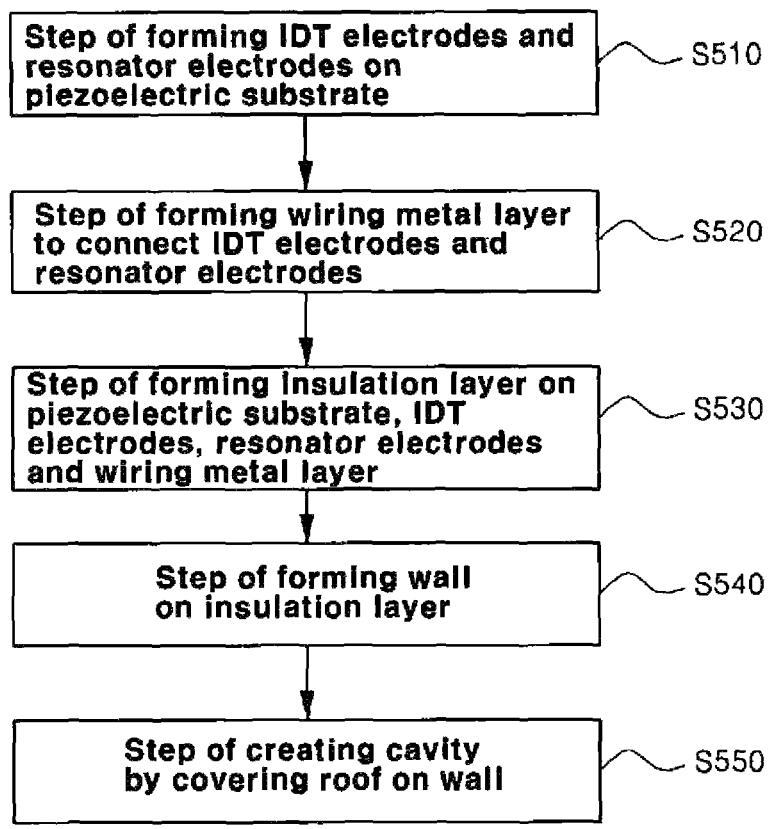
FIG. 6 is an overall flowchart illustrating a method of manufacturing a surface acoustic wave element according to an embodiment of the present invention.

The wiring metal layer 340 connecting the plurality of IDT electrodes and the plurality of resonator electrodes is formed to directly contact with the piezoelectric substrate while surrounding the resonator electrodes as described above, and the width 341 of the wiring metal layer directly contacting with the piezoelectric substrate is preferably at least 5 μm or more FIG. 6 is an overall flowchart illustrating a method of manufacturing a surface acoustic wave element according to an embodiment of the present invention.

Referring to FIG. 6, a plurality of IDT electrodes and a plurality of resonator electrodes are formed on a piezoelectric substrate (step S510). At this point, when the electrodes are formed, they are formed by etching after vacuum deposition of a sputtering method is performed.

The wiring metal layer is formed as a wiring area to connect the plurality of IDT electrodes and the plurality of resonator electrodes (step S520).

At this point, the wiring metal layer and the resonator electrode may include one or more of aluminum (Al), titanium (Ti) and gold (Au), and it is preferable that the wiring metal layer is formed of titanium (Ti) and the resonator electrode is formed of aluminum (Al).

At this point, when the wiring area is formed, it is preferable that the wiring metal layer is formed to surround the plurality of resonator electrodes and directly contact with the piezoelectric substrate. In addition, the width of the wiring metal layer directly contacting with the piezoelectric substrate is preferably 5 μm or more.

After the wiring metal layer is formed, an insulation layer is formed on the piezoelectric substrate, the plurality of IDT electrodes, the plurality of resonator electrodes and the wiring metal layer (step S530). At this point, the insulation layer may include one or more of silicon nitride (SiNx) and silicon dioxide (SiO2).

In addition, after the insulation layer is formed, a wall is formed on the insulation layer (step S540), and a roof is formed on the wall and creates a cavity (step S550). At this point, the wall and the roof are preferably formed of photosensitive resin.

According to the present invention, it is possible to improve adhesive force between the cavity, the electrodes and the wiring metal layer formed on a piezoelectric element and improve characteristics and reliability of a filter by effectively designing the electrodes and the wiring metal layer formed on the piezoelectric substrate without changing the material of resin or using a dual structure to improve the adhesive force.

In addition, the surface acoustic wave filter of the present invention may lower the probability of generating a fault in a part even in an environment maintaining high humidity by strengthening the adhesive force between the piezoelectric element, the electrodes and the wiring metal layer when the surface acoustic wave filter is manufactured by forming a cavity on the piezoelectric element.

In addition, since the wiring metal layer directly contacts with the piezoelectric substrate in the form of surrounding the resonator electrodes, the surface acoustic wave filter of the present invention may increase the adhesive force greatly.

In addition, since the bonding force of the bonding interface between the wiring metal layer and the Piezoelectric substrate is excellent, the surface acoustic wave filter of the present invention may simultaneously improve reliability and characteristics of parts by designing the surface acoustic wave filter to minimize the bonding area between the resonator electrodes and the wiring metal layer and maximize the bonding area between the wiring metal layer and the piezoelectric substrate.

In addition, the surface acoustic wave filter of the present invention may obtain a result of further improving a gain width while constantly maintaining the frequency characteristic, compared with a surface acoustic wave filter of the prior art.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A surface acoustic wave element comprising:
a piezoelectric substrate;
a plurality of interdigital transducer (IDT) electrodes formed on the piezoelectric substrate;
a plurality of resonator electrodes formed on the piezoelectric substrate;
a wiring metal layer formed as a wiring area to electrically connect the plurality of IDT electrodes and the plurality of resonator electrodes; and
an insulation layer formed on the piezoelectric substrate, the plurality of IDT electrodes, the plurality of resonator electrodes and the wiring metal layer,
wherein when the wiring area is formed, the wiring metal layer is formed to surround the plurality of resonator electrodes and directly contact with the piezoelectric substrate.

2. The element according to claim 1, wherein a width of the wiring metal layer directly contacting with the piezoelectric substrate is 5 µm or more.

3. The element according to claim 1, wherein the wiring metal layer and each of the resonator electrodes includes one or more of aluminum (Al), titanium (Ti) and gold (Au).

4. The element according to claim 3, wherein the wiring metal layer is formed of titanium (Ti), and each of the resonator electrodes is formed of aluminum (Al).

5. The element according to claim 1, wherein the insulation layer includes one or more of silicon nitride (SiNx) and silicon dioxide (SiO2).

6. The element according to claim 1, further comprising:
a wall formed on the insulation layer; and
a roof formed on the wall to create a cavity.

7. The element according to claim 6, wherein the wall and the roof are formed of photosensitive resin.

8. A method of manufacturing a surface acoustic wave element, the method comprising the steps of:

(a) forming a plurality of interdigital transducer (IDT) electrodes and a plurality of resonator electrodes on a piezoelectric substrate;
(b) forming a wiring metal, layer as a wiring area to connect the plurality of IDT electrodes and the plurality of resonator electrodes; and
(c) forming an insulation layer on the piezoelectric substrate, the plurality of IDT electrodes, the plurality of resonator electrodes and the wiring metal layer,
wherein when the wiring area is formed at step (b), the wiring metal layer is formed to surround the plurality of resonator electrodes and directly contact with the piezoelectric substrate.

9. The method according to claim 8, wherein a width of the wiring metal layer directly contacting with the piezoelectric substrate is 5 µm or more.

10. The method according to claim 8, wherein the wiring metal layer and each of the resonator electrodes includes one or more of aluminum (Al), titanium (Ti) and gold (Au).

11. The method according to claim 10, wherein the wiring metal layer is formed of titanium (Ti), and each of the resonator electrodes is formed of aluminum (Al).

12. The method according to claim 8, wherein the insulation layer includes one or more of silicon nitride (SiNx) and silicon dioxide (SiO2).

13. The method according to claim 8, wherein when the plurality of IDT electrodes and the plurality of resonator electrodes are formed at step (a), the electrodes are formed by etching after vacuum deposition of a sputtering method is performed.

14. The method according to claim 8, further comprising the steps of:
(d) forming a wall on the insulation layer; and
(e) forming a roof on the wall to cover the wall and create a cavity.

15. The method according to claim 14, wherein the wall and the roof are formed of photosensitive resin.

* * * * *